(12) United States Patent
Nakashiba

(10) Patent No.: US 7,564,113 B2
(45) Date of Patent: Jul. 21, 2009

(54) SOLID STATE IMAGING DEVICE

(75) Inventor: Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 176 days.

(21) Appl. No.: 11/747,419

(22) Filed: May 11, 2007

(65) Prior Publication Data
US 2007/0278543 A1 Dec. 6, 2007

(30) Foreign Application Priority Data
Jun. 1, 2006 (JP) .............................. 2006-153183

(51) Int. Cl.
*H01L 21/00* (2006.01)
(52) U.S. Cl. ................. 257/435; 257/436; 257/447
(58) Field of Classification Search ............. 257/435, 257/436, 447
See application file for complete search history.

(56) References Cited
U.S. PATENT DOCUMENTS 4,941,029 A * 7/1990 Bluzer ..................... 257/435
6,171,885 B1 * 1/2001 Fan et al. ................... 438/70
6,403,998 B1 6/2002 Inoue
7,453,131 B2 * 11/2008 Marshall et al. ............ 257/438
2002/0005906 A1 1/2002 Ohkubo et al.
2007/0210395 A1 * 9/2007 Maruyama et al. ......... 257/431

FOREIGN PATENT DOCUMENTS

| JP | 2000-217803 | 8/2000 |
|---|---|---|
| JP | 2002-033469 | 1/2002 |
| JP | 2006-19757 | 1/2006 |

OTHER PUBLICATIONS

Chinese Office Action - 200710108833 - Jan. 23, 2009.

* cited by examiner

*Primary Examiner*—Douglas M Menz
(74) *Attorney, Agent, or Firm*—Young & Thompson

(57) ABSTRACT

A solid-state imaging device includes a semiconductor substrate, photodetector elements, and blocking layers. The solid-state imaging device receives light on the back surface, and photoelectrically converts light incident upon the back surface of the semiconductor substrate, thereby acquiring an image of an object to be imaged. The photodetector elements receive the signal charge generated through the photoelectric conversion. Between a region in the semiconductor substrate where the photodetector elements are provided and the back surface, the blocking layers are provided. The blocking layers suppress diffusion of the signal charge.

6 Claims, 6 Drawing Sheets

SOLID STATE IMAGING DEVICE

This application is based on Japanese patent application No. 2006-153183, the content of which is incorporated hereinto by reference.

BACKGROUND

1. Technical Field

The present invention relates to a solid-state imaging device.

2. Related Art

Solid-state imaging devices so far developed include the one disclosed in Japanese laid-open Publication No. 2000-217803 and Japanese laid-open Publication No. 2002-33469. The solid-state imaging device according to these documents includes a plurality of photodetector elements (phototransistors) that are two-dimensionally aligned. In addition to the foregoing documents, literature on the related art of the present invention also includes Japanese laid-open Publication No. 2006-19757.

The present inventor has recognized as follows. In the foregoing solid-state imaging devices, however, a signal charge supposed to reach one of the photodetector elements may sometimes reach another photodetector element (especially, the adjacent photodetector element). This leads to degradation in modulation transfer function (hereinafter, MTF).

SUMMARY

According to the present invention, there is provided a solid-state imaging device that photoelectrically converts light incident upon a back surface of a semiconductor substrate, thereby acquiring an image of an object to be imaged, comprising a photodetector element that receives a signal charge generated through the photoelectric conversion, provided in the semiconductor substrate; and a blocking layer that suppresses diffusion of the signal charge, provided between a region in the semiconductor substrate where the photodetector element is provided and the back surface.

The solid-state imaging device thus constructed includes, in the semiconductor substrate, the blocking layer that suppresses the diffusion of the signal charge. Such structure reduces the probability that the signal charge supposed to reach one of the photodetector elements reaches another photodetector element. As a result, the MTF can be improved.

Thus, the present invention provides a solid-state imaging device having a higher MTF.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
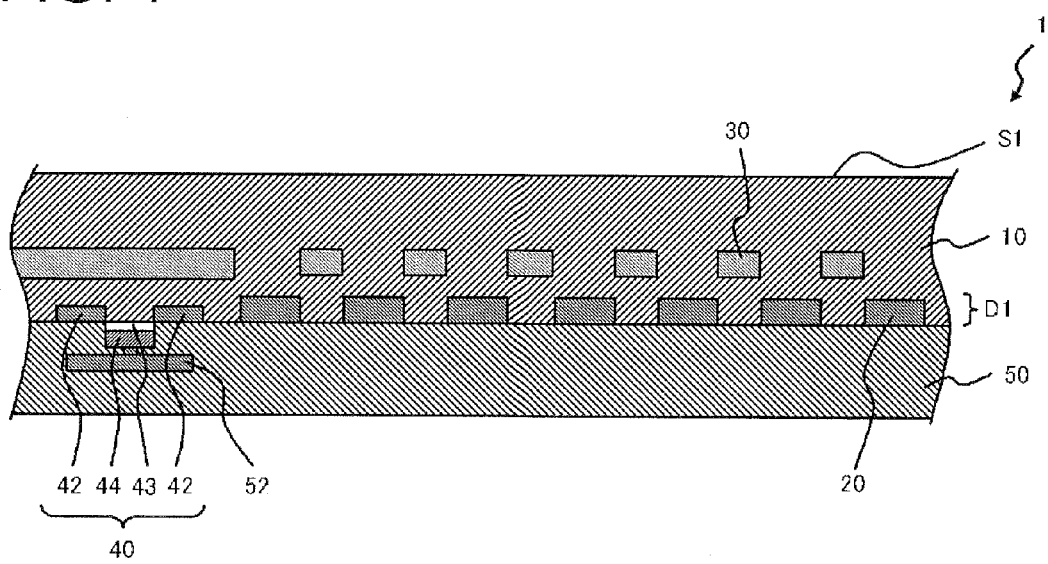
FIG. 1 is a cross-sectional view showing a solid-state imaging device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a solid-state imaging device according to the present invention will be described in details, referring to the accompanying drawings. In the drawings, same constituents are given the same numerals, and the description thereof will not be repeated.

First Embodiment

FIG. 1 is a cross-sectional view showing a solid-state imaging device according to a first embodiment of the present invention. The solid-state imaging device 1 includes a semiconductor substrate 10, photodetector elements 20, and blocking layers 30. In this embodiment, the semiconductor substrate 10 is a P type silicon substrate. The solid-state imaging device 1 receives light on the back surface thereof, and photoelectrically converts the light incident upon the back surface S1 of the semiconductor substrate 10, to thereby acquire an image of an object to be imaged.

The semiconductor substrate 10 includes a plurality of photodetector elements 20 aligned at a predetermined interval. More specifically, the photodetector elements 20 are located in the surface layer on the upper surface of the semiconductor substrate 10 (opposite to the back surface S1). The photodetector elements 20 serve to receive a signal charge generated through the photoelectric conversion. In this embodiment, the photodetector element 20 is an N type impurity diffused layer. The photodetector elements 20 constitute a photodiode in combination with the semiconductor substrate 10 adjacent thereto.

Between a region D1 in the semiconductor substrate 10 where the photodetector elements 20 are provided and the back surface S1, the blocking layers 30 are provided. To be more detailed, each of the blocking layers 30 is located in the interval between the respective ones of the photodetector elements 20 in a plan view. The blocking layer 30 serves to suppress the diffusion of the signal charge. In this embodiment, the blocking layer 30 is an insulating layer such as a silicon oxide layer.

The semiconductor substrate 10 also includes a MOSFET 40. Thus, the solid-state imaging device 1 includes a combination of a MOS image sensor unit including the photodetector elements 20 and so forth and a logic circuitry including the MOSFET 40 and so forth. The MOSFET 40 includes an N type impurity diffused layer 42 that serves as a source/drain region, a gate insulating layer 43, and a gate electrode 44.

On the upper surface of the semiconductor substrate 10, an interconnect layer 50 is provided. The interconnect layer 50 includes an interconnect 52.

Figure 2:
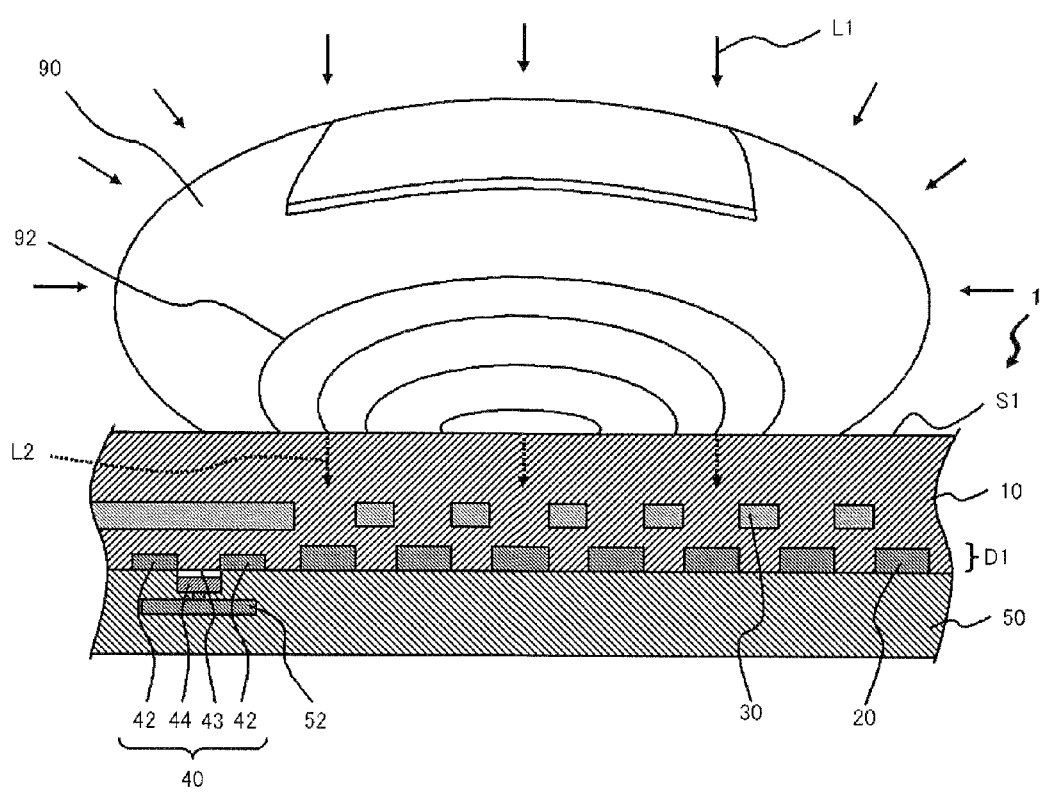
FIG. 2 is a cross-sectional view for explaining an operation of the solid-state imaging device shown in FIG. 1.

Referring to FIG. 2, an operation of the solid-state imaging device 1 will now be described. In FIG. 2, a finger 90, which corresponds to the object to be imaged, is brought into contact with the back surface S1. When light L1 from a light source such as a fluorescent light or LED is irradiated upon the finger 90, the transmitted light L2 enters on the back surface S1. Accordingly, the transmitted light L2 carries information on the shape of the fingerprint 92 of the finger 90. The transmitted light L2 is then photoelectrically converted in the semiconductor substrate 10. The photodetector elements 20 receive the signal charge generated by the photoelectric conversion, to thereby acquire an image of the fingerprint 92. Here, the light L1 may be visible light, near-infrared light or infrared light.

This embodiment offers the following advantageous effects. In the solid-state imaging device 1, the semiconductor substrate 10 includes the blocking layers 30 which suppress the diffusion of the signal charge. Such structure reduces the probability that the signal charge supposed to reach one of the photodetector elements reaches another one. As a result, the MTF, and hence the resolution can be improved.

Each of the blocking layers 30 is located in the interval between the respective ones of the photodetector elements 20 in a plan view. Such configuration allows inhibiting the signal charge from reaching another photodetector element 20, without disturbing the signal charge from reaching the photodetector element 20 that the signal charge is supposed to reach.

The blocking layer 30 is constituted of an insulating layer. Such structure facilitates fabrication of the semiconductor substrate 10 that includes the blocking layer 30. For example, a substrate having a partial SOI structure may be employed as the semiconductor substrate 10.

The solid-state imaging device 1 receives the light on the back surface thereof. Accordingly, the object to be imaged can be kept from contacting the front surface side (the side of the interconnect layer 50) of the solid-state imaging device 1. Such configuration allows preventing damage to the solid-state imaging device 1, and suppressing degradation in characteristics and static breakdown. This results in upgraded reliability of the solid-state imaging device 1. For example, when the object to be imaged is a finger, since the interconnect is located on the opposite side of the finger which is charged, an excessive amount of static electricity originating from the finger can be kept from being applied to the elements (photodetector elements 20, MOSFET 40 and so on) provided in the semiconductor substrate 10.

In the case of employing near-infrared light or infrared light as the light L1 (Ref. FIG. 2), the transmitted light L2 reaches a deeper position in the back surface S1 than when visible light is employed. Employing such light, accordingly, facilitates the signal charge generated from the photoelectric conversion of the transmitted light L2 to reach the photodetector elements 20.

Meanwhile, the Japanese laid-open Publication No. 2006-19757 discloses a solid-state imaging device that includes a light-shielding layer on a back surface of a silicon substrate. The light-shielding layer serves, literally, to block light, specifically the light incident upon the back surface. Such light-shielding layer is, therefore, of a different nature from the blocking layer 30 provided for suppressing the diffusion of the electron generated through the photoelectric conversion.

Second Embodiment

Figure 3:
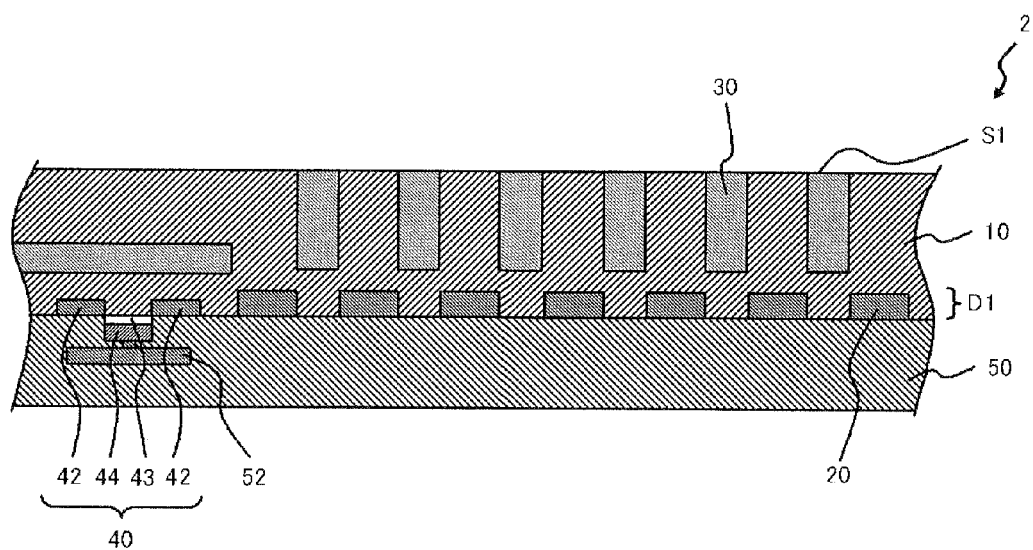
FIG. 3 is a cross-sectional view showing a solid-state imaging device according to a second embodiment of the present invention.

FIG. 3 is a cross-sectional view showing a solid-state imaging device according to a second embodiment of the present invention. The solid-state imaging device 2 includes the semiconductor substrate 10, the photodetector elements 20, and the blocking layers 30. In the solid-state imaging device 2, the structure of the blocking layer 30 is different from that in the solid-state imaging device 1 shown in FIG. 1. The structure of the remaining portion of the solid-state imaging device 2 is substantially the same as that of the solid-state imaging device 1.

In this embodiment the blocking layer 30 extends into an inner part of the semiconductor substrate 10, from the back surface S1 thereof. In other words, an end portion of the blocking layer 30 is exposed on the back surface S1, and the other end portion is buried inside the semiconductor substrate 10.

A difference between the solid-state imaging device 1 and the solid-state imaging device 2 may be described as follows. In the solid-state imaging device 1, the signal charge that should reach one of the photodetector elements 20 may still reach another one, through above the blocking layer 30 (a region between the blocking layer 30 and the back surface S1). In the solid-state imaging device 2, in contrast, since the blocking layer 30 extends up to the back surface S1 of the semiconductor substrate 10, the path above the blocking layer 30 for the signal charge is blocked. Such structure of the solid-state imaging device 2 can further reduce the probability that the signal charge supposed to reach one of the photodetector elements reaches another one, compared with the solid-state imaging device 1. Except for the foregoing, the solid-state imaging device 2 offers substantially the same advantageous effects as those offered by the solid-state imaging device 1.

The blocking layer 30 exposed on the back surface S1 of the semiconductor substrate 10 as in this embodiment may be formed, for example, by preparing the semiconductor substrate 10 including the blocking layers 30 buried therein (Ref. semiconductor substrate 10 shown in FIG. 1), and then polishing the back surface S1 of the semiconductor substrate 10 until the blocking layer 30 is exposed. Alternatively, the blocking layers 30 may be formed by forming grooves on the back surface S1 of the semiconductor substrate 10, and filling the grooves with an insulating layer.

Third Embodiment

Figure 4:
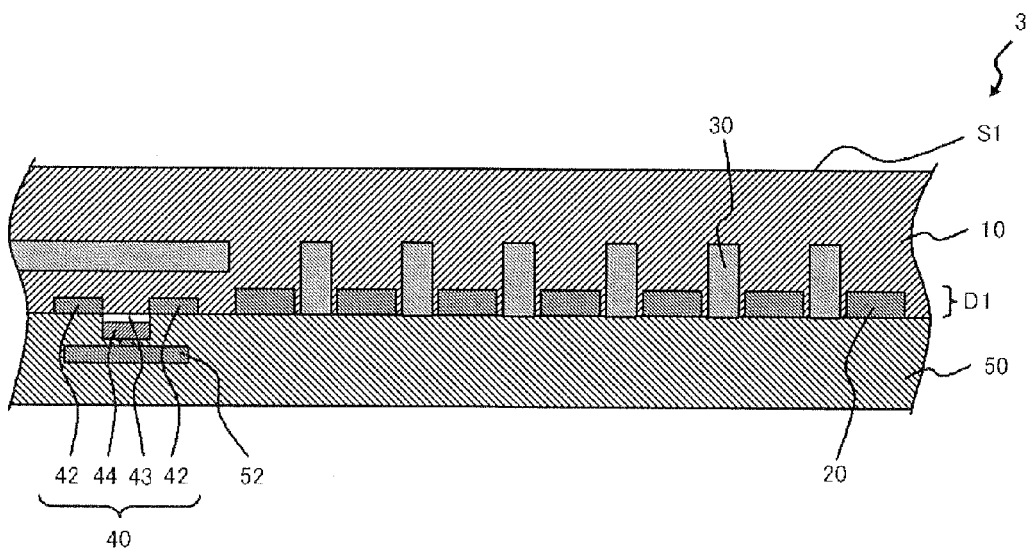
FIG. 4 is a cross-sectional view showing a solid-state imaging device according to a third embodiment of the present invention.

FIG. 4 is a cross-sectional view showing a solid-state imaging device according to a third embodiment of the present invention. The solid-state imaging device 3 includes the semiconductor substrate 10, the photodetector elements 20, and the blocking layers 30. In the solid-state imaging device 3, the structure of the blocking layer 30 is different from that in the solid-state imaging device 1 shown in FIG. 1. The structure of the remaining portion of the solid-state imaging device 3 is substantially the same as that of the solid-state imaging device 1.

In this embodiment the blocking layer 30 extends into an inner part of the semiconductor substrate 10, from the upper surface thereof. In other words, an end portion of the blocking layer 30 is exposed on the upper surface, and the other end portion is buried inside the semiconductor substrate 10.

A difference between the solid-state imaging device 1 and the solid-state imaging device 3 may be described as follows. In the solid-state imaging device 1, the signal charge that should reach one of the photodetector elements 20 may still reach another one, through under the blocking layer 30 (a region between the blocking layer 30 and the upper surface of the semiconductor substrate 10). In the solid-state imaging device 3, in contrast, since the blocking layer 30 extends up to the upper surface of the semiconductor substrate 10, the path under the blocking layer 30 for the signal charge is blocked. Such structure of the solid-state imaging device 3 can further reduce the probability that the signal charge supposed to reach one of the photodetector elements 20 reaches another one, compared with the solid-state imaging device 1. Except for the foregoing, the solid-state imaging device 3 offers substantially the same advantageous effects as those offered by the solid-state imaging device 1.

Fourth Embodiment

Figure 5:
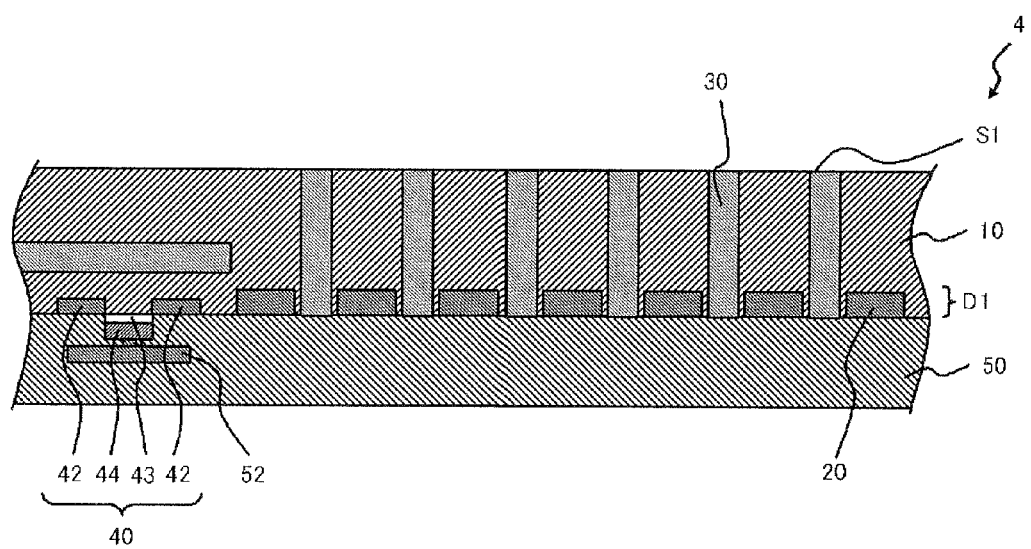
FIG. 5 is a cross-sectional view showing a solid-state imaging device according to a fourth embodiment of the present invention.

FIG. 5 is a cross-sectional view showing a solid-state imaging device according to a fourth embodiment of the present invention. The solid-state imaging device 4 includes the semiconductor substrate 10, the photodetector elements 20, and the blocking layers 30. In the solid-state imaging device 4, the structure of the blocking layer 30 is different from that in the solid-state imaging device 1 shown in FIG. 1. The structure of the remaining portion of the solid-state imaging device 4 is substantially the same as that of the solid-state imaging device 1.

In this embodiment the blocking layer 30 is provided so as to penetrate through the semiconductor substrate 10. In other words, one end portion of the blocking layer 30 is exposed on the back surface S1 of the semiconductor substrate 10, and the other end portion is exposed on the upper surface thereof.

In the solid-state imaging device 4, the paths for the signal charge above and under the blocking layer 30 are both blocked for the reason already described in the second and the third embodiment. Such structure of the solid-state imaging device 4 can further reduce the probability that the signal charge supposed to reach one of the photodetector elements reaches another one, compared with the solid-state imaging device 2 and 3. Except for the foregoing, the solid-state imaging device 4 offers substantially the same advantageous effects as those offered by the solid-state imaging device 1.

The solid-state imaging device according to the present invention is not limited to the foregoing embodiments, but various modifications may be made. To cite a few examples, while the N-channel MOSFET (MOSFET 40 of FIG. 1 and others) is used in the foregoing embodiments, a P-channel MOSFET may further be used. Also, while the solid-state imaging device 10 includes the P type semiconductor substrate and the N type photodetector elements, the semiconductor substrate may be of N type and the photodetector elements may be of P type. Further, the present invention may also be applied to a solid-state imaging device of a charge-coupled device (CCD) type.

Figure 6:
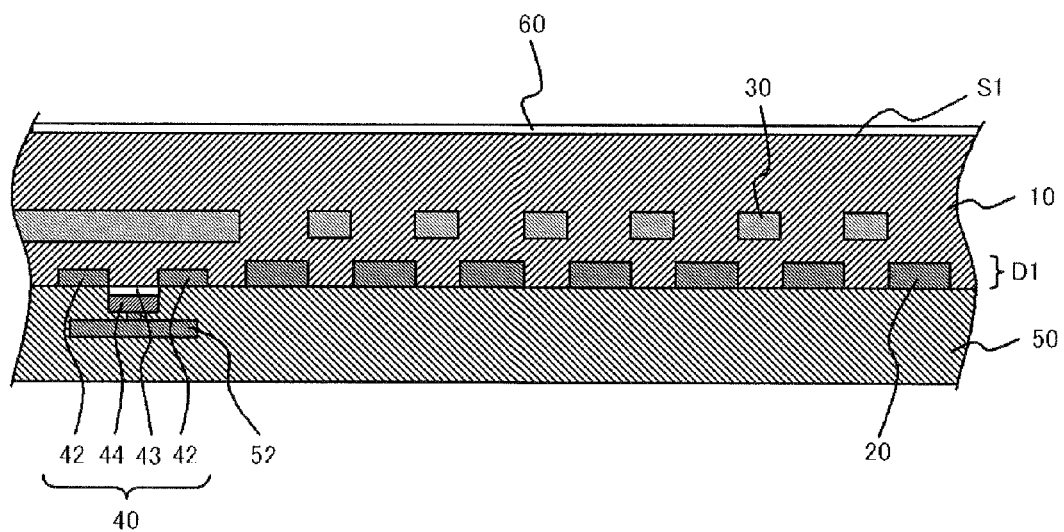
FIG. 6 is a cross-sectional view showing a variation of the solid-state imaging device according to the embodiment.

Further, the back surface S1 of the semiconductor substrate 10 is exposed in the foregoing embodiments. However, a cover layer 60 may be provided on the back surface S1 of the semiconductor substrate 10, as shown in FIG. 6. Providing thus the cover layer 60 allows effectively preventing the diffusion of impurity or the like stuck to the finger into the semiconductor substrate 10, and the resultant degradation in performance of the photodetector elements 20 and the MOSFET 40 provided opposite side to the cover layer 60. The cover layer 60 may be formed of SiO, SiN or SiON. The cover layer 60 may have a thickness of, for instance, approximately 0.3 μm. Forming the cover layer 60 as thin as approximately 0.3 μm, so as to make it thinner than the wavelength of the incident light, allows preventing the cover layer 60 from affecting the imaging operation.

Figure 7A:
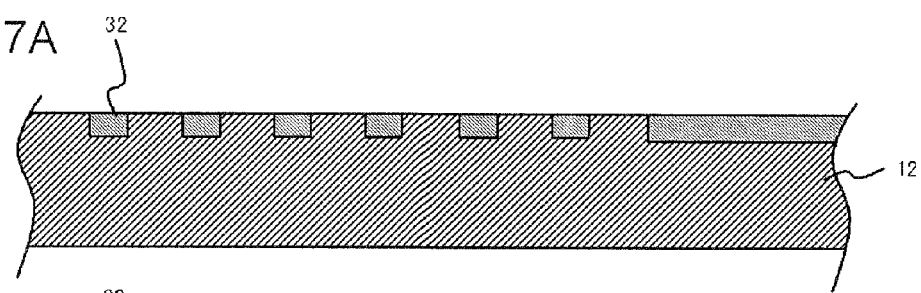
FIGS. 7A to 7C are cross-sectional views for explaining other variations of the embodiments.
Figure 7B:
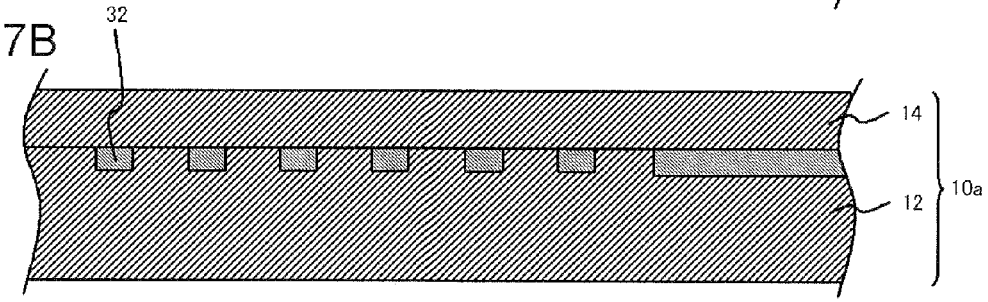
Figure 7C:
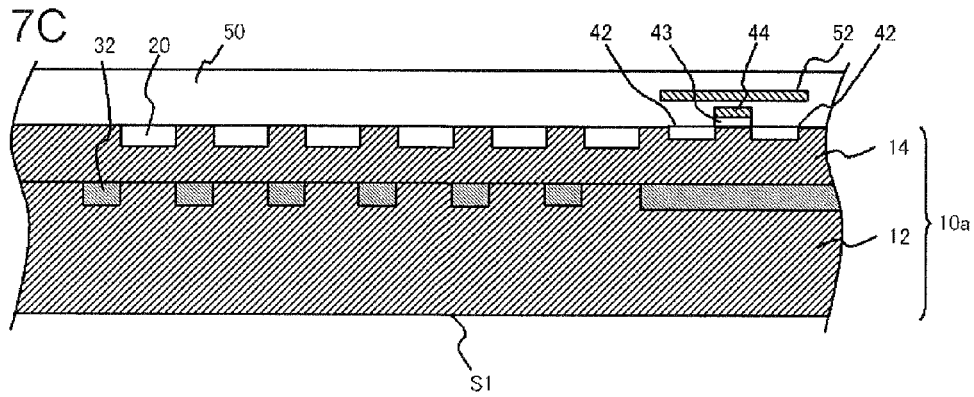

Still further, an insulating layer is employed as the blocking layer in the foregoing embodiments. However, the material of the blocking layer is not limited to the insulating layer, as long as the material is capable of suppressing the diffusion of the signal charge. For example, a P+ type impurity diffused layer may be employed as the blocking layer. This may be achieved, for example, by implanting boron or the like onto a predetermined region of the surface layer of a P type silicon substrate 12 so as to form a P+ type impurity diffused layer 32 (FIG. 7A), and then forming a P type epitaxial layer 14 on the P type silicon substrate 12 (FIG. 7B). Through such process, a semiconductor substrate 10a including the P+ type impurity diffused layer 32 is obtained. Further, forming the photodetector elements 20 and the N type impurity diffused layer 42 in the P type epitaxial layer 14, and forming the interconnect layer 50 including the gate insulating layer 43, the gate electrode 44, and the interconnect 52 on the P type epitaxial layer 14 leads to construction of the structure shown in FIG. 7C. The P+ type impurity diffused layer 32 recombines with the signal charge, thereby inhibiting the diffusion thereof. It is apparent that the present invention is not limited to the above embodiment, and may be modified and changed without departing from the scope and spirit of the invention.

What is claimed is:

1. A solid-state imaging device for photoelectrically converting light incident upon a back surface of a semiconductor substrate, thereby acquiring an image of an object to be imaged, comprising:
    a photodetector element receiving a signal charge generated through said photoelectric conversion, provided in said semiconductor substrate; and
    a blocking layer suppressing diffusion of said signal charge, provided between a region in said semiconductor substrate where said photodetector element is provided and said back surface.

2. The solid-state imaging device according to claim 1, further comprising:
    a plurality of photodetector elements provided at a predetermined interval;
    wherein said blocking layer is located in said interval between said plurality of photodetector elements, in a plan view.

3. The solid-state imaging device according to claim 1, wherein said blocking layer is an insulating layer.

4. The solid-state imaging device according to claim 1, wherein said blocking layer extends from said back surface into an inner part of said semiconductor substrate.

5. The solid-state imaging device according to claim 1, wherein said blocking layer extends from an upper surface of said semiconductor substrate opposite to said back surface, into an inner part of said semiconductor substrate.

6. The solid-state imaging device according to claim 1, wherein said blocking layer is disposed so as to penetrate through said semiconductor substrate.

* * * * *